United States Patent
Li (10) Patent No.: US 9,858,881 B2
(45) Date of Patent: Jan. 2, 2018

(54) ARRAY SUBSTRATE, ITS DRIVING METHOD AND DISPLAY DEVICE

(71) Applicant: BOE TECHNOLOGY GROUP CO., LTD., Beijing (CN)

(72) Inventor: Wenbo Li, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/907,782

(22) PCT Filed: Aug. 10, 2015

(86) PCT No.: PCT/CN2015/086448
§ 371 (c)(1),
(2) Date: Jan. 26, 2016

(87) PCT Pub. No.: WO2016/161729
PCT Pub. Date: Oct. 13, 2016

(65) Prior Publication Data
US 2017/0039972 A1     Feb. 9, 2017

(30) Foreign Application Priority Data

Apr. 8, 2015 (CN) .......................... 2015 1 0163454

(51) Int. Cl.
*G09G 3/36* (2006.01)
*G02F 1/1362* (2006.01)

(52) U.S. Cl.
CPC ..... *G09G 3/3677* (2013.01); *G02F 1/136286* (2013.01); *G09G 3/3688* (2013.01);
(Continued)

(58) Field of Classification Search
None
See application file for complete search history.

(56) References Cited

U.S. PATENT DOCUMENTS

2013/0141658 A1    6/2013  Lv et al.
2013/0256707 A1*  10/2013  Chiang .................. H01L 33/08
                                                                              257/88
(Continued)

FOREIGN PATENT DOCUMENTS

CN        101814261 A      8/2010
CN        102681273 A      9/2012
(Continued)

OTHER PUBLICATIONS

First Office Action for Chinese Application No. 201510163454.5, dated Feb. 28, 2017, 6 Pages.
(Continued)

*Primary Examiner* — Joseph Haley
*Assistant Examiner* — Emily Frank
(74) *Attorney, Agent, or Firm* — Brooks Kushman P.C.

(57) ABSTRACT

The present disclosure provides an array substrate, its driving method and a display device. The array substrate includes a plurality of gate lines, a plurality of data lines, and a plurality of subpixels defined by the gate lines and the data lines crossing each other. At least one additional line for providing an additional data signal is arranged between the subpixels in two adjacent columns, the subpixels in an identical column correspond to at least one additional line, and at least one subpixel among the subpixels in an identical column is driven by the additional line corresponding to the at least one subpixel.

13 Claims, 7 Drawing Sheets

(52) U.S. Cl.
CPC ............... *G09G 2300/0426* (2013.01); *G09G 2300/0439* (2013.01); *G09G 2310/027* (2013.01); *G09G 2310/0289* (2013.01); *G09G 2310/08* (2013.01)

(56) References Cited

U.S. PATENT DOCUMENTS

| | | | |
|---|---|---|---|
| 2015/0022512 A1* | 1/2015 | Ahn | G09G 3/3607 345/212 |
| 2016/0188097 A1* | 6/2016 | Shin | G06F 3/0416 345/173 |
| 2017/0039972 A1 | 2/2017 | Li | |

FOREIGN PATENT DOCUMENTS

| | | | |
|---|---|---|---|
| CN | 102707524 A | 10/2012 | |
| CN | 104730791 A | 6/2015 | |
| JP | 2014098863 A | 5/2014 | |
| KR | 20140137831 A | 12/2014 | |

OTHER PUBLICATIONS

International Search Report and Written Opinion for Application No. PCT/CN2015/086448, dated Dec. 25, 2015, 13 Pages.

* cited by examiner

Figure 1:
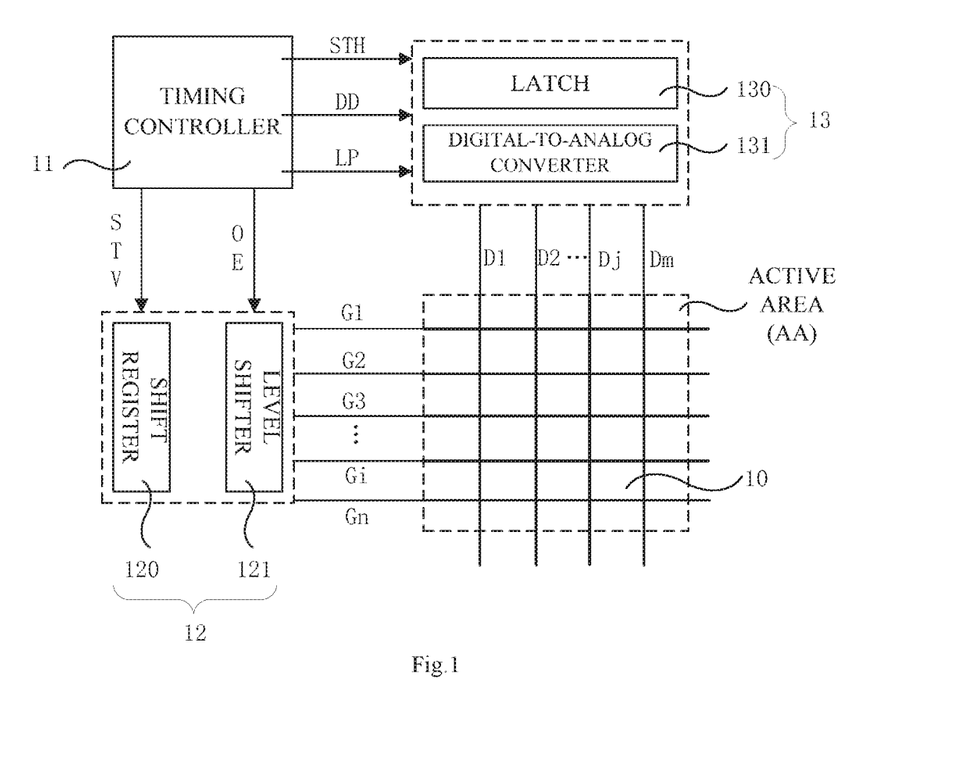
FIG. 1 is a schematic view showing an existing display device.

Gn) and a plurality of data lines (D1, D2, D3, …, Dj, … Dm) crossing each other. Within the inactive area, there is a timing controller 11, a gate driver 12 and a source driver 13.

The timing controller 11 is configured to output a gate driver start signal (STV) to the gate driver 12, and then the received STV is shifted level by level through a shift register 120, so as to output a scanning signal. A level shifter 121 receives the scanning signal and determines whether or not to output the scanning signal to the gate line (e.g., Gi) in accordance with a signal, i.e., Output Enable signal. Meanwhile, the timing controller 11 outputs a source driver start signal (STH), a digital data (DD) signal and a latch input (LP) signal to the source driver 13. In a latch 130, the DD signal is latched by the STH into a corresponding channel, and whether or not to output the DD signal to the data line (e.g., Dj) is determined in accordance with the LP signal. Then, the DD signal is converted into a data signal Vdata via a digital-to-analog converter 131. When the gate lines are turned on progressively, the data signal Vdata is inputted into the corresponding data line, so as to display an image.

However, for an existing display with high pixels per inch (PPI), there are a large number of subpixels 10, so a large number of gate lines are required. In this case, when the gate lines (G1, G2, G3, …, Gi, … Gn) are turned on progressively, there is a delay for the subpixels 10 in a row, which are turned on late, to receive the data signal Vdata from the data line (D1, D2, D3, …, Dj, … Dm). As a result, a response speed for the display will be reduced, and thereby the display quality of the display with high PPI will be adversely affected.

SUMMARY

An object of the present disclosure is to provide an array substrate, its driving method and a display device, so as to prevent the occurrence of delay for the subpixels, which are turned on late, to receive the data signal when the gate lines are turned on progressively.

In one aspect, the present disclosure provides in some embodiments an array substrate, including a plurality of gate lines, a plurality of data lines, and a plurality of subpixels defined by the gate lines and the data lines crossing each other. At least one additional line for providing an additional data signal is arranged between the subpixels in two adjacent columns, the subpixels in an identical column correspond to at least one additional line, and at least one subpixel among the subpixels in an identical column is driven by the additional line corresponding to the at least one subpixel.

In another aspect, the present disclosure provides in some embodiments a display device including the above-mentioned array substrate.

In yet another aspect, the present disclosure provides in some embodiments a method for driving an array substrate, including steps of inputting a scanning signal to at least two gate lines simultaneously, inputting a data signal to subpixels controlled by one of the gate lines via data lines, and inputting an additional data signal to subpixels controlled by the other gate lines via at least one additional line.

According to the array substrate, its driving method and the display device in the embodiments of the present disclosure, the array substrate includes the plurality of gate lines, the plurality of data lines, and the plurality of subpixels defined by the gate lines and data lines crossing each other. In addition, the at least one additional line for providing the additional data signal is arranged between the subpixels in two adjacent columns, the subpixels in an identical column corresponds to at least one additional line, and at least one subpixel among the subpixels in an identical column is driven by the additional line corresponding to the at least one subpixel. In this way, a plurality of gate lines may be scanned by a gate driver simultaneously through the additional line, the subpixels arranged in different rows and connected with the data line and the additional line may be turned on simultaneously and may receive the data signal from the data line and the additional data signal from the additional line. As a result, it is able to improve a transmission speed of the data signal or the additional data signal for displaying the image, thereby to increase the ability to drive the display device to display the image and improve the response speed of the display device.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 2:
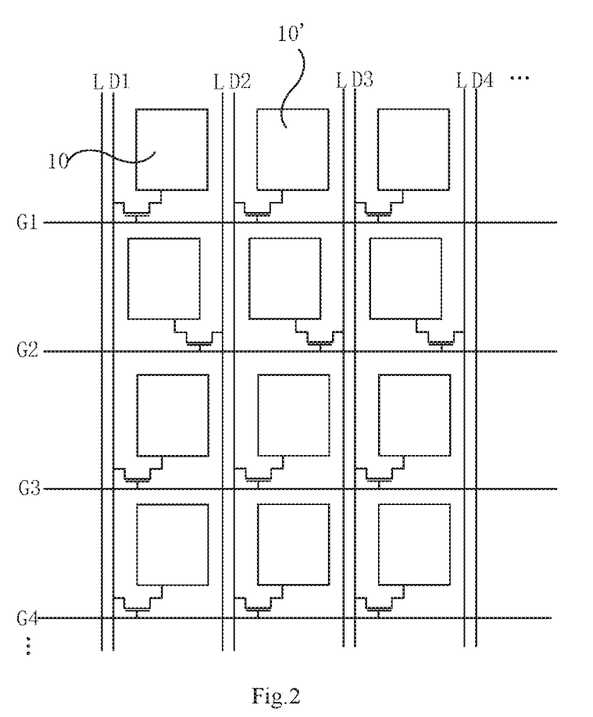
FIG. 2 is a schematic view showing an array substrate according to one embodiment of the present disclosure.

The present disclosure provides in some embodiments an array substrate which, as shown in FIG. 2, may include a plurality of gate lines (G1, G2, G3, . . . , Gi, . . . Gn), a plurality of data lines (D1, D2, D3, . . . , Dj, . . . Dm), and a plurality of subpixels 10 defined by the gate lines (G1, G2, G3, . . . , Gi, . . . Gn) and the data lines (D1, D2, D3, . . . , Dj, . . . Dm) crossing each other, where i and j are each an integer greater than or equal to 0, and n and m are each an integer greater than or equal to 1. The term "a plurality of" may refer to "at least one".

In addition, at least one additional line L for providing an additional data signal Add_Vdata is arranged between subpixels 10 and subpixels 10' in two adjacent column, and the subpixels 10 in an identical column correspond to at least one additional line L. At least one subpixel among the subpixels 10 in an identical column is driven by the additional line L corresponding to the at least one subpixel.

It should be appreciated that, the additional line L in the embodiments of the present disclosure functions in the same as the data lines (D1, D2, D3, . . . Dm) in FIG. 1, i.e., they are all used to receive a signal for displaying an image from e source driver 13 in FIG. 1. Hence, the additional data signal Add_Vdata and the data signal Vdata are both signals for displaying the image, As shown in FIG. 2, the subpixels 10 in at least one row are driven by the additional line L. In this way, it is able to input a scanning signal to the gate line G1 and the gate line G2 simultaneously, thereby to turn on the subpixels 10 in a first row and in a second row simultaneously, without any need to scan the gate line G1 and the gate line G2 progressively. The subpixels 10 in the first row receive the data signal Vdata from the data line D1, and the subpixels 10 in the second row receive the additional data signal Add_Vdata from the additional line L. The gate line G1 and the gate line G2 are scanned simultaneously, so it is able to reduce the occurrence of signal delay for a portion of the subpixels when receiving the signal from the source driver, thereby to improve the response speed of a display device.

The term "column" may refer to a direction in which the data line extends, and the term "row" may refer to a direction in which the gate line extends.

An extension direction of the additional line L is approximately identical to an extension direction of the data lines (D1, D2, D3, . . . , Dj, . . . Dm). Alternatively, the additional line L may be parallel to the data lines (D1, D2, D3, . . . , Dj, . . . Dm). In this way, it is able to prevent the occurrence of short circuit when the additional line L crosses the data lines (D1, D2, D3, . . . , Dj, . . . Dm), or prevent an increase in a coupling capacitance when the additional line L overlaps the data lines (D1, D2, D3, . . . , Dj, . . . Dm).

In additional, all or parts of the additional lines L may be arranged at a layer and made of a material identical to the data lines (D1, D2, D3, . . . , Dj, . . . Dm), so as to simplify the manufacture thereof.

According to the array substrate in the embodiments of the present disclosure, the array substrate includes the plurality of gate lines, the plurality of data lines, and the plurality of subpixels defined by the gate lines and data lines crossing each other. In addition, the at least one additional line for providing the additional data signal is arranged between the subpixels in two adjacent columns, the subpixels in an identical column corresponds to at least one additional line, and at least one subpixel among the subpixels in an identical column is driven by the additional line corresponding to the at least one subpixel, in this way, a plurality of gate lines may be scanned by a gate driver simultaneously through the additional line, the subpixels arranged in different rows and connected with the data line and the additional line may be turned on simultaneously and may receive the data signal from the data line and the additional data signal from the additional line. As a result, it is able to improve a transmission speed of the data signal or the additional data signal for displaying the image, thereby to increase the ability to drive the display device to display the image and improve the response speed of the display device.

The array substrate may be of different structures depending on the number of the additional lines L. The structures of the array substrate will be described hereinafter.

First Embodiment

Figure 3:
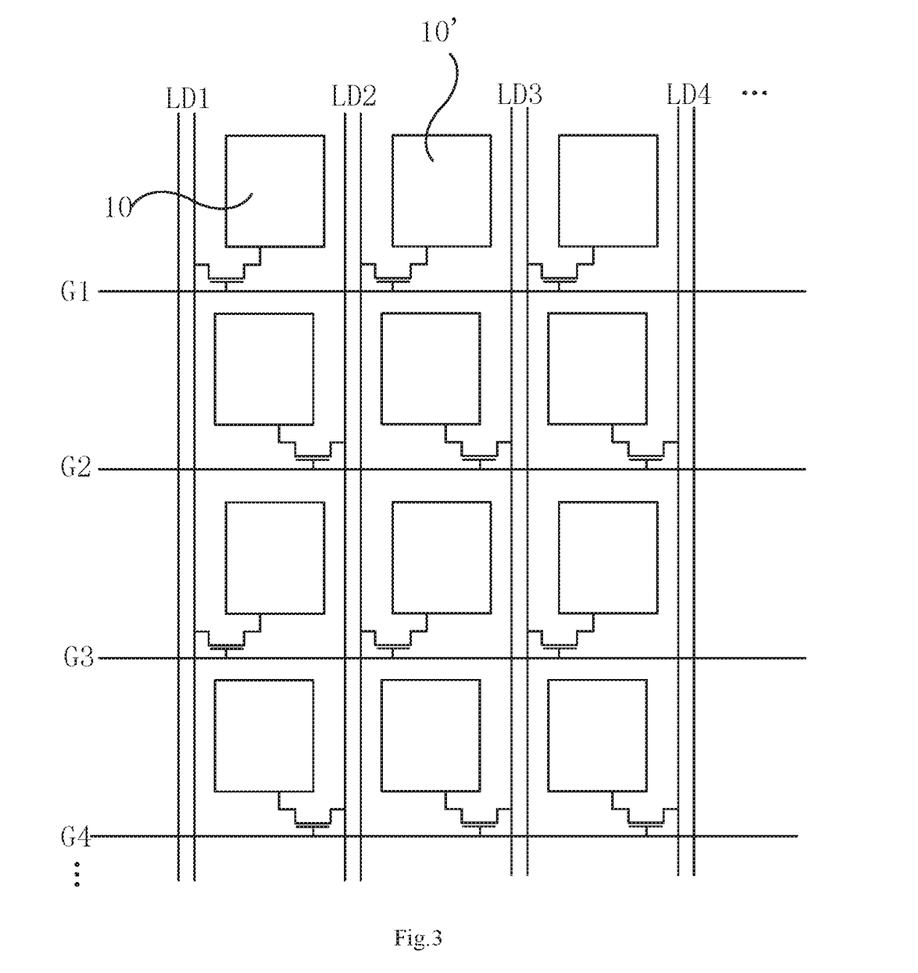
FIG. 3 is another schematic view showing the array substrate according to one embodiment of the present disclosure.

One additional line L is arranged between the subpixels 10 and the subpixels 10' in two adjacent columns, and the subpixels 10 in an identical column correspond to one data line and one additional line, e.g., the subpixels 10 in a first column in FIG. 3 correspond to the data line D1 on the left and the additional line L on the right.

Switching units, e.g., TFTs, of the subpixels 10 in a $(2i+1)^{th}$ row are connected to the data lines (D1, D2, D3, . . . , Dj, . . . Dm) corresponding to the subpixels 10, and TFTs of the subpixels 10 in a $(2i+2)^{th}$ row are connected to the additional line L corresponding to the subpixels 10, where i is an integer greater than or equal to 0.

To be specific, as shown in FIG. 3, the TFTs of the subpixels 10 in an odd-numbered row are connected to the data lines (D1, D2, D3, . . . , Dj, . . . Dm), while the TFTs of the subpixels 10 in an even-numbered row are connected to the additional line L. In this way, the gate driver 12 may output a scanning signal to the gate line G2i+1 and the gate line G2i+2 simultaneously, so as to turn on the subpixels in the $(2i+1)^{th}$ row and the $(2i+2)^{th}$ row simultaneously. At this time, the source driver 13 may output the data signal V data to the data lines (D1, D2, D3, ..., Dj, ... Dm) and the additional data signal Add_Vdata to each additional line 1, so as to display an image.

Because the two gate lines are scanned simultaneously, the subpixels 10 corresponding to the gate line G2i+2 and the subpixels 10 corresponding to the gate line G2i+1 may receive the signal for displaying an image from the source driver 13 simultaneously, so as to prevent the occurrence of a signal delay for the subpixels 10 corresponding to the gate line G2i+2 when the gate line G2i+1 and the gate line G2i+2 are scanned progressively but the latter is turned on later than the former. As a result, it is able to reduce the signal delay and improve the response speed of the display device.

Second Embodiment

Two additional lines L are arranged between the subpixels 10 and the subpixels 10' in two adjacent columns, and the subpixels 10 in an identical column correspond to one data line and two additional lines L. The two additional lines include a first additional line L1 and a second additional line L2, e.g., in FIG. 4, the subpixels 10 in a first column correspond to the data line D1 on the left, and the first additional line L1 and the second additional line L2 on the right.

Figure 4:
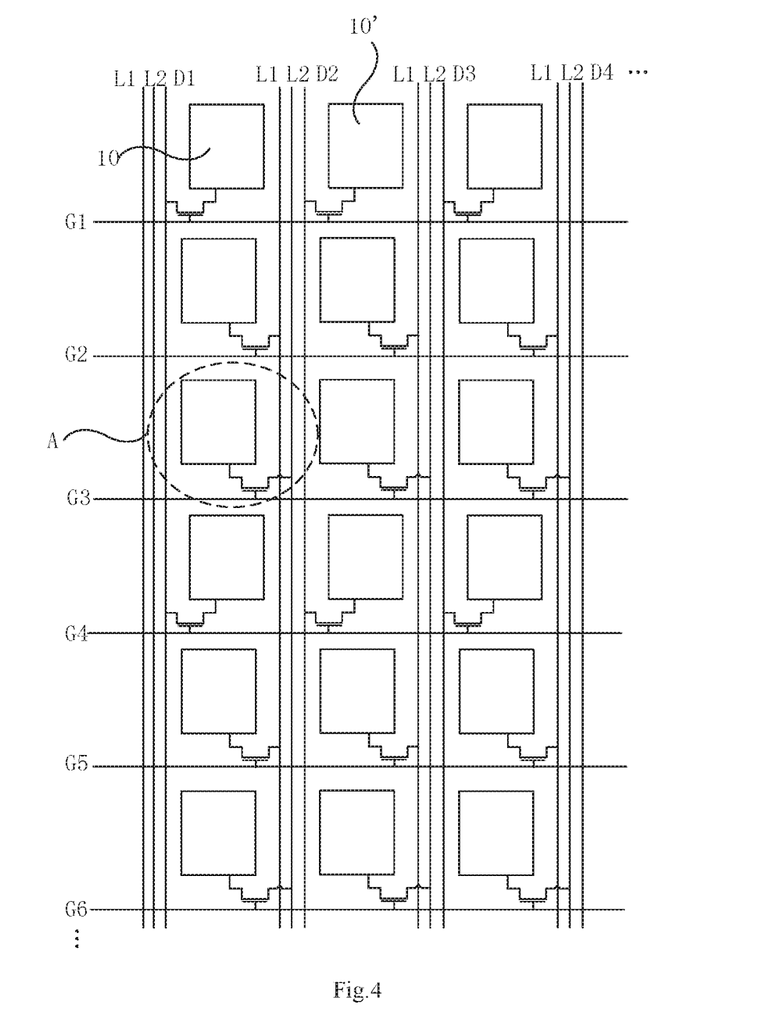
FIG. 4 is yet another schematic view showing the array substrate according to one embodiment of the present disclosure.

TFTs of the subpixels 10 in a $(3i+1)^{th}$ row are connected to the data lines (D1, D2, D3, ..., Dj, ... Dm) corresponding to the subpixels 10, TFTs of the subpixel 10 in a $(3i+2)^{th}$ row are connected to the first additional line L1 corresponding to the subpixels 10, and TFTs of the subpixels 10 in a $(3i+3)^{th}$ row are connected to the second additional line L2 corresponding to the subpixels 10, where i is an integer greater than or equal to 0.

To be specific, as shown in FIG. 4, the TFTs of the subpixels 10 in a first row and a fourth row are connected to the data lines (D1, D2, D3, ..., Dj, ... Dm), the TFTs of the subpixels 10 in a second row and a fifth row are connected to the first additional lines L1, and the TFTs of the subpixels 10 in a third row and a sixth row are connected to the second additional lines L2.

In this way, the gate driver 12 may input a scanning signal to gate lines G3i+1, G3i+2 and G3i+3 simultaneously, so as to turn on the subpixels 10 in the $(3i+1)^{th}$, the $(3i+2)^{th}$ and the $(3i+3)^{th}$ rows simultaneously. At this time, the source driver 13 may input the data signal Vdata to the data lines (D1, D2, D3, ..., Dj, ... Dm), input a first additional data signal Add_Vdata1 to each first additional line L1 and input a second additional data signal Add_Vdata2 to each second additional line 2, so as to display an image. In accordance with the practical need for displaying the image, the first additional data signal Add_Vdata1 may be identical to or different from the second additional data signal Add_Vdata2.

Because the three gate lines are scanned simultaneously, the subpixels 10 corresponding to the gate lines G3i+3, G3i+2 and G3i+1 may receive a signal for displaying the image from the source driver 13 simultaneously, so as to prevent the occurrence of a signal delay for the subpixels 10 corresponding to the gate line G3i+2 when the gate lines G3i+1 and G3i+2 are scanned progressively but the latter is turned on later than the former. As a result, it is able to reduce the signal delay and improve the response speed of the display device.

As compared with the first embodiment, in the second embodiment more gate lines are turned on at a time, so the source driver 13 may output the signal more quickly and thereby the response speed of the display device may be higher. However, more additional lines L are arranged in the second embodiments, and as compared with the first embodiment, when a wiring area is constant, the data lines (D1, D2, D3, ..., Dj, ... Dm) and the additional lines L may be each of a narrower width in the second embodiment. At this time, a manufacturing process and its accuracy are highly demanded.

In a word, when more gate lines are turned on simultaneously, it is required to provide more additional lines, and at this time, a delay rate of the signal is lower, the response speed of the display device, and the manufacturing process and its accuracy are more highly demanded. In the embodiments of the present disclosure, merely the array substrate with one or two additional lines corresponding to the subpixels in an identical column is described, Of course, the array substrate may include more than two additional lines corresponding to the subpixels in an identical column, and the number of the additional lines is not particularly defined herein. In addition, in both the first embodiments and the second embodiments, the subpixels corresponding to the odd-numbered gate lines and the subpixels corresponding to the even-numbered wile lines are connected to different data lines (D1, D2, D3, ..., Dj, ... Dm) or additional lines L. Of course, the present disclosure is not limited to this connection mode, and the gate lines corresponding to the subpixels 10 connected to the additional lines L and the gate lines corresponding to the subpixels 10 connected to the data lines (D1, D2, D3, ..., Dj, ... Dm) are not particularly defined, as long as the signal lines for providing the data signal to the gate lines which are turned on simultaneously are different from each other. For example, when it is required to turn on the gate line G1 and the gate line G4, the subpixels 10 corresponding to the gate line G1 may be connected to the data lines (D1, D2, D3, ..., Dj, ... Dm) while the subpixels 10 corresponding to the gate line G4 may be connected to the additional lines. Alternatively, when it is required to turn on the gate lines G2, G7 and G10 simultaneously, the subpixels 10 corresponding to the gate line G2 may be connected to the data lines (D1, D2, D3, ..., Dj, ... Dm), the subpixels 10 corresponding to the gate line G7 may be connected to the first additional lines L1, and the subpixels 10 corresponding to the gate line G10 may be connected to the second additional lines L2. The other connection modes are not particularly defined herein.

For the array substrate in the second embodiment, the arrangement mode for the first additional lines L1 and the second additional lines L2 will be described hereinafter.

Third Embodiment

Figure 5A:
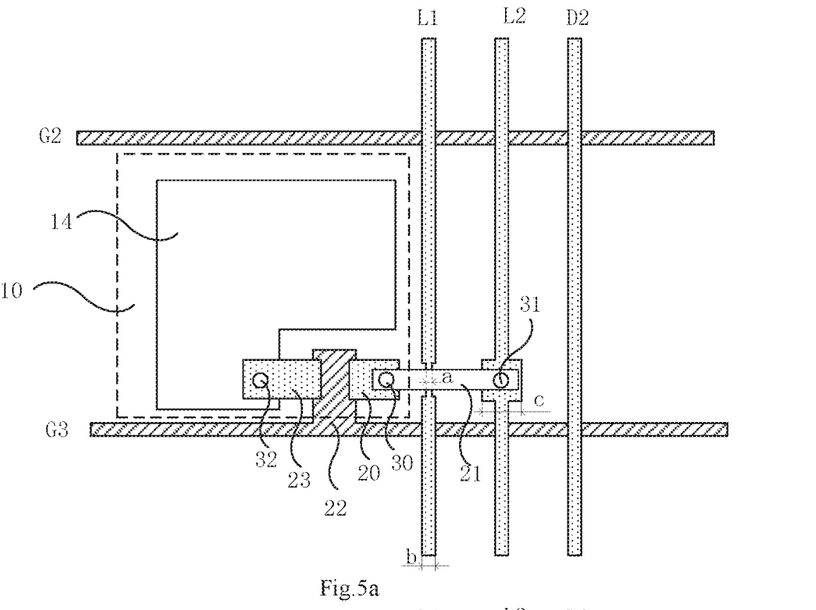
FIG. 5a is a topical enlarged view of a portion A in FIG. 4.

As shown in FIG. 4 or 5a, each first additional line L1 is arranged between the subpixels 10 and each second additional line L2. A first via-hole 30 is provided in a. source electrode 20 of the TFT of each subpixel 10 in the $(3i+3)^{th}$ row (e.g., the third row), and second via-holes 31 are provided in each second additional line L2.

The source electrode 20 of the TFT of each subpixel 10 in the $(3i+3)^{th}$ row (e.g., the third row is connected to the second additional line through a first lapping electrode layer 21 through the first via-hole 30 and the second via-hole 31, so as to enable the TFT of each subpixel 10 in the $(3i+3)^{th}$ row to be connected to the second line L2. The first lapping electrode layer 21 maybe made of a transparent conductive material, e.g., indium tin oxide or indium zinc oxide, or made of a gate metal layer which forms a gate electrode 22 of the TFT.

A width a of a portion of each first additional line L1 overlapping the first lapping electrode layer 21 may be less than a width b of the first additional line L1. Alternatively, a width of a portion of the first lapping electrode layer 21 overlapping the first additional line L1 may be less than a width of the other portion of the first lapping electrode layer 21. In this way, it is able to reduce a coupling capacitance by reducing an overlapping area between the first additional line L1 and the first lapping electrode layer 21.

In addition, a width c of a portion of the second additional line L2 with the second via-hole 31 is greater than a width b of the other portion of the second additional line L2. Alternatively, a width of a portion of the first lapping electrode layer 21 overlapping the second additional line L2 is greater than a width of the other portion of the first lapping electrode layer 21. In this way, it is able to improve the electrical connection at the second via-hole 31 in the second additional line L2 by increasing the width of a portion of the first lapping electrode layer 21 or the second additional line L2.

Further, a contact electrode may be formed in the first via-hole 30 and the second via-hole 31 while forming the first lapping electrode layer 21, and the contact electrode is configured to connect the first lapping electrode layer 21 to the second additional line L2, or in some other embodiments, to the other additional line such as L1. When the via-holes are each of a small aperture size, a small contact electrode may be formed. Hence, in the case of ensuring the electrical connection, the aperture size of each via-hole may be reduced in accordance with the practical need, so as to provide a small contact electrode.

Fourth Embodiment

Figure 5B:
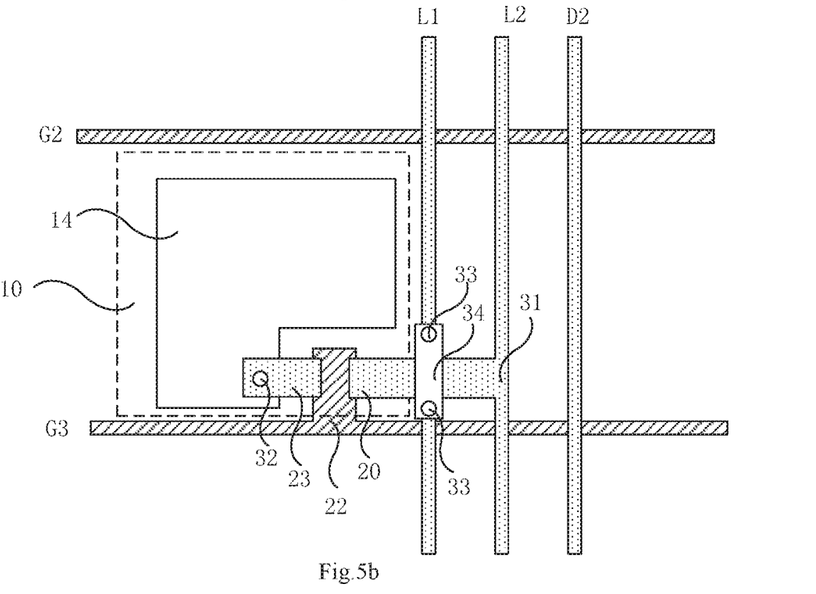
FIG. 5b is another topical enlarged view of the portion A in FIG. 4.

As shown in FIG. 5b, each first additional line L1 is arranged between the subpixels 10 and each second additional line L2. Each first additional line L1 is divided into two portions, i.e., an upper portion and a lower portion at a position where the second additional line L2 is connected to the source electrode 20 of the TFT, and fourth via-holes 33 are provided in the upper and lower portions of the first additional line L1. Through the fourth via-holes 33, the upper and lower portions of the first additional line L1 are electrically connected to each other by a second lapping electrode layer 34.

In addition, alternatively, a source electrode 20 of the TFT of each subpixel 10 among the subpixels 10 in the $(3i+3)^{th}$ row (e.g., the third row) may be arranged at a layer and made of a material identical to the second additional line L2, so as to simplify the manufacture process.

In this way, as compared with the third embodiment, the upper and lower portions of each first additional line L1 are electrically connected to each other by the second lapping electrode layer 34 in this embodiment, so as to prevent a region where the TFT is located from being adversely affected, e.g., short-circuited, due to a processor error when the first via-hole 30 is formed in the source electrode 20 of the TFT in addition, a length of the second lapping electrode layer 34 is smaller than at of the first lapping electrode layer 21, so as to increase the signal transmission speed.

A method for manufacturing the array substrate will be described hereinafter by taking the array substrate in the second embodiment as an example.

At first, a layer of gate lines is formed on a substrate. For example, a gate metal layer may be deposited on a transparent substrate, e.g., a glass substrate, by sputtering. The gate metal layer may be made of Cu, Al, Mo, Ti, Cr or W, or an alloy thereof Of course, the gate metal layer may be of a single-layered structure, or a multi-layered structure such as Mo/Al/Mo, Ti/Cu/Ti or Mo/Ti/Cu.

Then, a photoresist may be applied onto the substrate with the gate metal layer, and exposed, developed and etched so as to form patterns of the gate lines (G1, G2, G3, ..., Gi, ... Gn) and gate electrodes 22. Of course, patterns of common electrode lines (not shown) may also be formed.

Then, a gate insulation layer may be deposited by, e.g., plasma enhanced chemical vapor deposition (PECVD), and it may be made of SiN.

Next, an active layer may be formed. To be specific, a-Si may be deposited by PECVD or indium gallium zinc oxide (IGZO) may be deposited by sputtering onto a surface of the substrate with the gate insulation layer. A photoresist may be applied, and then exposed, developed and etched, so as to form the active layer.

Next, a layer of data lines may be formed. For example, a data line metal layer may be deposited onto a surface of the substrate with the active layer by sputtering. The data line metal layer may be made of Cu, Al, Mo, Ti, Cr or W, or an alloy thereof. A photoresist may be applied onto the data line metal layer, and then exposed, developed and etched so as to form the data lines (D1, D2, D3, ..., Dj, ... Dm), the first additional lines L1, the second additional lines L2, and the source electrodes 20 and the drain electrodes 23 of the TFTs.

Next, a passivation layer may be formed. For example, SiN may be deposited by PECVD or a resin layer may be applied onto a surface of the substrate e above structure A photoresist may be applied, and then exposed, developed and etched to form the first via-holes 30, the second via-holes 31, and the third via-holes 32 at positions corresponding to the drain electrodes 23. Each first via-hole 30 is configured to expose the source electrode 20, each second via-hole 31 is configured to expose the second additional line L2, and each third via-hole 30 is configured to expose the drain electrode 23.

Finally, pixel electrodes may be formed. To be specific, a transparent conductive layer, e.g., indium tin oxide (ITO), may be deposited onto a surface of the substrate with the above structure by sputtering. A photoresist may be applied onto the transparent conductive layer, and then exposed, developed and etched so as to form the pixel electrodes 14 and the first lapping electrode layer 21. Each pixel electrode 14 is connected to the drain electrode 23 through the third via-hole 32, and the source electrode 20 is connected to the second additional line L2 through the first via-hole 20 and the second via-hole 31.

It should be appreciated that, the above method for manufacturing the array substrate is merely for illustrative purpose, and any other method may also be used, e.g., the gate insulation layer, the active layer and the layer of data lines may be formed by a single patterning process.

In the above method, the pixel electrodes 14 may be formed at first. Thereafter, the gate metal layer may be deposited onto the pixel electrodes 14, and then exposed, developed and etched to form the first lapping electrode layer 21. At this time, the first lapping electrode layer 21 is made of a material identical to the drain electrodes 22. Here, the first lapping electrode layer 21 is made of a metallic material, and as compared with the transparent conductive material, it has better conductivity. However, the first lapping electrode layer 21 and the layer of the pixel electrodes 14 are formed in separate steps rather than simultaneously, so the manufacturing process is relatively complex. In a word, the methods for manufacturing the array substrate may be selected in accordance with the practical need.

The above description is merely given on the basis of the array substrate in the second embodiment, and the methods for manufacturing the array substrate with the other structures are not particularly defined herein.

The present disclosure further provides in some embodiments a display device including the above-mentioned array substrate, The structures and the beneficial effects of the display device may refer to those of the array substrate mentioned above, and they will not be repeated herein.

In the embodiments of the present disclosure, the display device may be any product or member having a display function, such as a liquid crystal display device, a liquid crystal television, a digital photo frame, a mobile phone or a fiat-panel computer.

Figure 6:
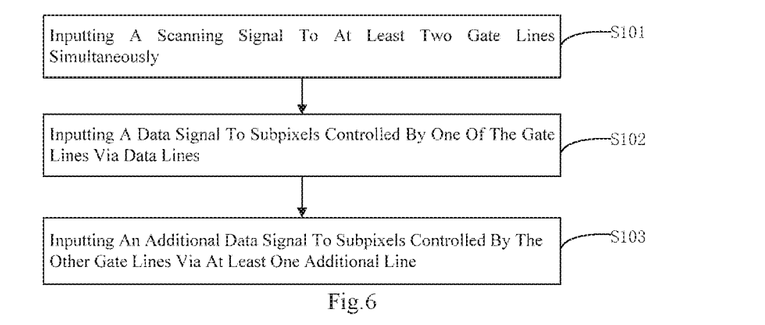
FIG. 6 is a flow chart of a method for driving the array substrate in FIG. 2.

The present disclosure further provides in some embodiments a method for driving the above-mentioned array substrate. As shown in FIG. 6, the method may include Step S101 of inputting a scanning signal to at least two gate lines simultaneously, Step S102 of inputting a data signal to subpixels controlled by one of the gate lines via data lines, and Step S103 of inputting an additional data signal to subpixels controlled by the other gate lines via at least one additional line. Steps S102 and S103 may be performed simultaneously.

According to the embodiments of the present disclosure, the method for driving the array substrate includes the steps of inputting the scanning signal to at least two gate lines simultaneously, inputting the data signal to the subpixels controlled by one of the gate lines via the data line, and inputting the additional data signal to the subpixels controlled by the other gate lines via at least one additional line. In this way, a plurality of gate lines may be scanned by a gate driver simultaneously by arranging the additional line, the subpixels arranged in different rows and connected with the data line and the additional line may be turned on simultaneously and may receive the data signal from the data line and the additional data signal from the additional line. As a result, it is able to improve a transmission speed of the data signal or the additional data signal for displaying the image, thereby to increase the ability to drive the display device to display the image and improve the response speed of the display device.

The array substrate may be of different structures depending on the number of the additional lines L, so the driving methods therefor may be different to some extent. The methods for driving he array substrate with different additional lines will be described hereinafter.

Fifth Embodiment

Figure 7:
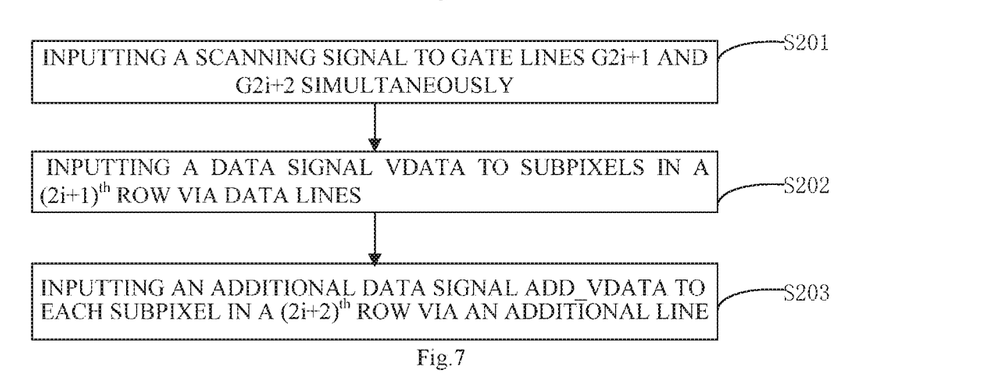
FIG. 7 is a flow chart of a method for driving the array substrate in FIG. 3.

As shown in FIG. 3, where one additional line L is arranged between the subpixels 10 and the subpixels 10' in two adjacent columns, the TFTs of the subpixels 10 in a $(2i+1)^{th}$ row are connected to the data lines (D1, D2, D3, ..., Dj, ... Dm) corresponding to the subpixels 10 and the TFTs of the subpixels 10 in a $(2i+2)^{th}$ row are connected to the additional line L corresponding to the subpixels 10, the driving method may, as shown in FIG. 7, include the following steps.

Step S201: inputting a scanning signal to the gate lines G2i+1 and G2i+2 simultaneously. To be specific, the timing controller 11 outputs a STV signal to the gate driver 12, and the received STV signal is shifted level by level by the shift register 120 so as to output the scanning signal. The level shifter 121 receives the scanning signal and output it o the gate lines G2i+1 and G2i+2 in accordance with an OE signal.

Step S202: inputting a data signal Vdata to the subpixels 10 in the $(2i+1)^{th}$ row via the data lines (D1, D2, D3, ..., Dj, ... Dm). To be specific, the timing controller 11 outputs a STH signal, a DD signal and an LP signal to the source driver 13, and the DD signal is latched in a corresponding channel in the latch 130 by the STH signal. Then, the DD signal is outputted to the data lines (D1, D2, D3, ..., Dj, ... Dm) in accordance with the LP signal. The DD signal is converted into the data signal Vdata via the digital-to-analog converter 131, and the data signal Vdata is then inputted to the subpixels 10 in the $(2i+1)^{th}$ row via the data lines (D1, D2, D3, ..., Dj, ... Dm).

Step S203: inputting an additional data signal Add_Vdata to the subpixels 10 in the $(2i+2)^{th}$ row via the additional line L.

Steps S202 and S203 may be performed simultaneously.

Because the two gate lines, i.e., G2i+1 and G2i+2, are scanned simultaneously, the subpixels 10 corresponding to the gate line G2i+2 and the subpixels 10 corresponding to the gate line G2i+1 may receive the signal for displaying an image from the source driver 13 simultaneously, so as to prevent the occurrence of a signal delay for the subpixels 10 corresponding to the gate line G2i+2 when the gate line G2i+1 and the gate line G2i+2 are scanned progressively but the latter is turned on later than the former. As a result, it is able to reduce the signal delay and improve the response speed of the display device.

Sixth Embodiment

Figure 8:
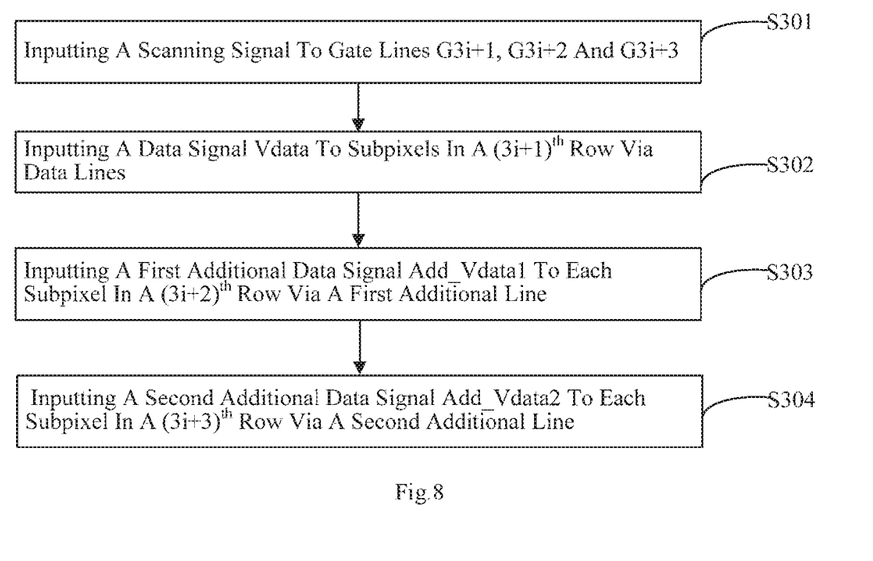
FIG. 8 is a flow chart of a method for driving the array substrate in FIG. 4.

As shown in FIG. 4, two additional lines are arranged between the subpixels 10 in two adjacent columns, the subpixels 10 in an identical column correspond to one data line and two additional lines, the two additional lines include the first additional line L1 and the second additional line L2, the TFTs of the subpixels 10 in the $(3i+1)^{th}$ row are connected to the data. lines (D1, D2, D3, ..., Dj, ... Dm) corresponding to the subpixels 10, the TFTs of the subpixels 10 in the $(3i+2)^{th}$ row are connected to the first additional line L1 corresponding to the subpixels 10, and the TFTs of the subpixels 10 in the $(3i+3)^{th}$ row are connected to the second additional line L2 corresponding to the subpixels 10. At this time, as shown in FIG. 8, the driving method may include Step S301 of inputting a scanning signal to the gate lines G3i+1, G3i+2 and G3i+3, Step S302 of inputting a data signal Vdata to the subpixels in the $(3i+1)^{th}$ row via the data lines (D1, D2, D3, ..., Dj, ... Dm), Step S303 of inputting a first additional data signal Add_Vdata1 to the subpixels 10 in the $(3i+2)^{th}$ row via the first additional line L1, and Step S304 of inputting a second additional data signal Add_Vdata2 to the subpixels 10 in the $(3i+3)^{th}$ row via the second additional line L2. Steps S302, S303 and S304 may be performed simultaneously.

Because the three gate lines, i.e., G3i+1, G3i+2 and G3i+3, are scanned simultaneously, the subpixels 10 corresponding to the gate lines G3i+3, G3i+2 and G3i+1 may receive a signal for displaying the image from the source driver 13 simultaneously, so as to prevent the occurrence of a signal delay for the subpixels 10 corresponding to the gate line G3i+2 when the gate lines G3i+1 and G3i+2 are scanned progressively but the latter is turned on later than the former. As a result, it is able to reduce the signal delay and improve the response speed of the display device.

As compared with the fifth embodiment, in the sixth embodiment more gate lines are turned on at a time, so the source driver 13 may output the signal more quickly and thereby the response speed of the display device may be higher.

It should be appreciated that, all or parts of the steps of the above method may be implemented by hardware related to programs, and these programs may be stored in a computer-readable storage medium. When being executed, these programs are configured to perform the steps of the above-mentioned method. The storage medium includes Read Only Memory (ROM), Random Access Memory (RAM), a magnetic disc or an optical disc that may store therein program codes.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. An array substrate, comprising a plurality of gate lines, a plurality of data lines, and a plurality of subpixels defined by the gate lines and the data lines crossing each other,
    wherein at least one additional line for providing an additional data signal is arranged between the subpixels in two adjacent columns, the subpixels in an identical column correspond to at least one additional line, and at least one subpixel among the subpixels in an identical column is driven by the additional line corresponding to the at least one subpixel,
    wherein two additional lines are arranged between the subpixels in two adjacent columns,
    the subpixels in an identical column correspond to one data line and two additional lines,
    the two additional lines comprise a first additional line and a second additional line
    switching units of the subpixels in a $(3i+1)^{th}$ row are connected to the data lines corresponding to the subpixels,
    switching units of the subpixels in a $(3i+2)^{th}$ row are connected to the first additional lines corresponding to the subpixels,
    switching units of the subpixels in a $(3i+3)^{th}$ row are connected to the second additional lines corresponding to the subpixels, and
    i is an integer greater than or equal to 0,
    wherein the first additional line is arranged between the subpixels and the second additional line,
    a source electrode of the switching unit of each subpixel among the subpixels in the $(3i+3)^{th}$ row is provided with a first via-hole,
    the second additional line is provided with a second via-hole, and
    the source electrode of the switching unit of each subpixel among the subpixels in the $(3i+3)^{th}$ row is connected to the second additional line via a first lapping electrode layer through the first via-hole and the second via-hole.

2. The array substrate according to claim 1, wherein a width of a portion of the first additional line overlapping the first lapping electrode layer is smaller than a width of the other portion of the first additional line, or
    a width of a portion of the first lapping electrode layer overlapping the first additional line is smaller than a width of the other portion of the first lapping electrode layer.

3. The array substrate according to claim 1, wherein a width of a portion of the second additional line provided with the second via-hole is greater than a width of the other portion of the second additional line, or
    a width of a portion of the first lapping electrode layer overlapping the second additional line is greater than a width of the other portion of the first lapping electrode layer.

4. The array substrate according to claim 1, wherein an extension direction of each additional line is approximately identical to an extension direction of the data line.

5. The array substrate according to claim 1, wherein all or parts of the additional lines are arranged at a layer and made of a material identical to the data lines.

6. A display device comprising the array substrate according to claim 1.

7. The display device according to claim 6, wherein a width of a portion of the first additional line overlapping the first lapping electrode layer is smaller than a width of the other portion of the first additional line, or
    a width of a portion of the first lapping electrode layer overlapping the first additional line is smaller than a width of the other portion of the first lapping electrode layer.

8. The display device according to claim 6, wherein a width of a portion of the second additional line provided with the second via-hole is greater than a width of the other portion of the second additional line, or
    a width of a portion of the first lapping electrode layer overlapping the second additional line is greater than a width of the other portion of the first lapping electrode layer.

9. The display device according to claim 6, wherein an extension direction of each additional line is approximately identical to an extension direction of the data line.

10. A method for driving an array substrate, comprising steps of:
    inputting a scanning signal to at least two gate lines simultaneously,
    inputting a data signal to subpixels controlled by one of the gate lines via a data lines, and
    inputting an additional data signal to subpixels controlled by the other gate lines via at least one additional line,
    wherein when two additional lines are arranged between the subpixels in two adjacent columns, the subpixels in an identical column correspond to one data line and two additional lines, the two additional lines comprise a first additional line and a second additional line, switching units of the subpixels in a $(3i+1)^{th}$ row are connected to the data lines corresponding to the subpixels, switching units of the subpixels in a $(3i+2)^{th}$ row are connected to the first additional line corresponding to the subpixels, and switching units of the subpixels in a $(3i+3)^{th}$ row are connected to the second additional line corresponding to the subpixels, the method comprises:
    inputting a scanning signal to gate lines in the $(3i+1)^{th}$ row, in the $(3i+2)^{th}$ and in the $(3i+3)^{th}$ row simultaneously,
    inputting the data signal to each subpixel in the $(3i+1)^{th}$ row via the data line,
    inputting a first additional data signal to each subpixel in the $(3i+2)^{th}$ row via the first additional line, and
    inputting a second additional data signal to each subpixel in the $(3i+3)^{th}$ row via the second additional line,
    wherein i is an integer greater than or equal to 0,
    wherein the first additional line is arranged between the subpixels and the second additional line,
    a source electrode of the switching unit of each subpixel among the subpixels in the $(3i+3)^{th}$ row is provided with a first via-hole, the second additional line is provided with a second via-hole, and the source electrode of the switching unit of each subpixel among the subpixels in the $(3i+3)^{th}$ row is connected to the second additional line via a first lapping electrode layer through the first via-hole and the second via-hole.

11. An array substrate, comprising a plurality of gate lines, a plurality of data lines, and a plurality of subpixels defined by the gate lines and the data lines crossing each other, wherein at least one additional line for providing an additional data signal is arranged between the subpixels in two adjacent columns, the subpixels in an identical column correspond to at least one additional line, and at least one subpixel among the subpixels in an identical column is driven by the additional line corresponding to the at least one subpixel, wherein two additional lines are arranged between the subpixels in two adjacent columns, the subpixels in an identical column correspond to one data line and two additional lines, the two additional lines comprise a first additional line and a second additional line, switching units of the subpixels in a $(3i+1)^{th}$ row are connected to the data lines corresponding to the subpixels, switching units of the subpixels in a $(3i+2)^{th}$ row are connected to the first additional lines corresponding to the subpixels, switching units of the subpixels in a $(3i+3)^{th}$ row are connected to the second additional lines corresponding to the subpixels, and i is an integer greater than or equal to 0, wherein the first additional line is arranged between the subpixels and the second additional line, and the first additional line is divided into an upper portion and a lower portion at a position where the second additional line is connected to a source electrode of the switching unit, the upper portion and the lower portion of the first additional line are each provided with a fourth via-hole through which the upper portion and the lower portion of the first additional line are electrically connected to each other via a second lapping electrode layer.

12. The array substrate according to claim 11, wherein an extension direction of each additional line is approximately identical to an extension direction of the data line.

13. The array substrate according to claim 11, wherein all or parts of the additional lines are arranged at a layer and made of a material identical to the data lines.

* * * * *